United States Patent
Lee

(10) Patent No.: US 8,405,309 B2
(45) Date of Patent: Mar. 26, 2013

(54) FLAT PANEL DISPLAY PANEL HAVING DAM SHAPED STRUCTURES AND METHOD OF MANUFACTURING THE SAME

(75) Inventor: Kyung-Jun Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/190,610

(22) Filed: Jul. 26, 2011

(65) Prior Publication Data

US 2012/0049728 A1    Mar. 1, 2012

(30) Foreign Application Priority Data

Sep. 1, 2010    (KR) .................. 10-2010-0085503

(51) Int. Cl.
*H01J 5/20* (2006.01)
*H01J 9/26* (2006.01)

(52) U.S. Cl. .......... 313/512; 313/504; 313/511; 445/24; 445/25

(58) Field of Classification Search .......... 313/498–512; 257/40, 269
See application file for complete search history.

(56) References Cited

U.S. PATENT DOCUMENTS

| | | | |
|---|---|---|---|
| 7,045,944 B2 * | 5/2006 | Ushifusa et al. | 313/489 |
| 8,093,512 B2 * | 1/2012 | Chen et al. | 174/523 |
| 2002/0030783 A1 * | 3/2002 | Taniguchi | 349/153 |
| 2007/0173167 A1 * | 7/2007 | Choi | 445/25 |
| 2009/0009046 A1 * | 1/2009 | Oh et al. | 313/1 |
| 2009/0295277 A1 * | 12/2009 | Logunov et al. | 313/504 |

FOREIGN PATENT DOCUMENTS

| | | |
|---|---|---|
| KR | 10-2007-0042353 | 4/2007 |
| KR | 10-2009-0025895 | 3/2009 |
| KR | 10-2009-0051943 | 5/2009 |
| KR | 10-0903622 | 6/2009 |

* cited by examiner

*Primary Examiner* — Tracie Y Green
(74) *Attorney, Agent, or Firm* — Robert E. Bushnell, Esq.

(57) ABSTRACT

In a flat panel display panel and a method of manufacturing the same, the flat panel display panel may be constructed with a first substrate on which a plurality of pixels are formed; a second substrate disposed so as to face a surface of the first substrate on which the plurality of pixels are formed; a first sealing member disposed between the first and second substrates for sealing them; a first bank formed on the first substrate; a second bank formed on the second substrate and disposed facing the first bank; and a second sealing member disposed between the first and second banks.

18 Claims, 7 Drawing Sheets

FLAT PANEL DISPLAY PANEL HAVING DAM SHAPED STRUCTURES AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Sep. 1, 2010 and there duly assigned Serial No. 10-2010-0085503.

BACKGROUND OF THE INVENTION

1. Field of the Invention

The present invention relates to a flat panel display panel and a method of manufacturing the same.

2. Description of the Related Art

Currently, display apparatuses tend to be replaced by portable and thin flat panel display devices. Flat panel display devices include liquid crystal display (LCD) devices, organic electroluminescence display devices, and plasma display panels (PDPs). A flat panel display panel included in a flat panel display device includes an LCD layer, an organic light-emitting diode (OLED), etc. disposed between a first substrate and a second substrate according to the type of flat panel display device, and a pixel circuit may be formed on the first substrate.

In a flat panel display panel, a reduction in lifetime may be caused by oxidation or desquamation of an electrode material, etc. if moisture or oxygen penetrates into the flat panel display panel from a peripheral environment, and a reduction in emission efficiency or a deterioration in color of emission light may also be caused due to deterioration of a liquid crystal material of an organic material. Accordingly, when a flat panel display panel is manufactured, a sealing process for sealing the flat panel display panel from the external environment is generally performed to prevent penetration of moisture or oxygen.

SUMMARY OF THE INVENTION

The present invention provides a flat panel display panel with improved mechanical strength and with the capability of absorbing impact by disposing an additional sealing member between a first substrate and a second substrate, and a method of manufacturing the flat panel display panel.

The present invention also provides a flat panel display panel capable of maximizing a bonding effect by increasing a bonding area of banks for accommodating a sealing member, and a method of manufacturing the flat panel display panel.

According to an aspect of the present invention, a flat panel display panel may include a first substrate on which a plurality of pixels are formed; a second substrate disposed so as to face a surface of the first substrate on which the plurality of pixels are formed; a first sealing member disposed between, and sealing, the first and second substrates; a first bank formed on the first substrate; a second bank formed on the second substrate and disposed so as to face the first bank; and a second sealing member disposed between the first and second banks.

For example, the first sealing member may be disposed around an emission region for displaying an image, and the first and second banks may be disposed around the first sealing member.

Alternatively, the first and second banks may be disposed around an emission region for displaying an image, and the first sealing member maybe disposed around the first and second banks.

The sum of a height of the first bank and a height of the second bank may be less than a distance between the first and second substrates.

The first bank may include a plurality of first dam shapes facing each other and forming a recess for accommodating the second sealing member, and the second bank may include a plurality of second dam shapes facing each other and forming a recess for accommodating the second sealing member, and facing the plurality of first dam shapes of the first bank.

The first bank may include a recess formed by the first substrate and two first dam shapes facing and separated from each other, or a recess formed by two first dam shapes facing each other and integrated on the first substrate. The second bank may include a recess formed by the second substrate and two second dam shapes facing and separated from each other, or a recess formed by two second dam shapes facing each other and integrated on the second substrate.

Also, the second sealing member may be filled in the recesses of the first and second banks, and may penetrate into a gap between the plurality of first dam shapes of the first bank and the plurality of second dam shapes of the second bank.

The first and second banks may have a gap between the first and second banks in an uneven structure in which the first and second banks are engaged with each other, and the second sealing member may be filled in the gap between the first and second banks.

The second sealing member may include at least one of epoxy, acryl, and urethane-based materials.

The first bank may be formed by using a material for forming a pixel defining layer of the first substrate.

According to another aspect of the present invention, a method of manufacturing a flat panel display panel may comprise forming a first bank on a first substrate on which a plurality of pixels are formed; forming a second bank on a surface of a second substrate facing the first substrate so as to face the first bank; coating a first sealing member on the surface of the second substrate; coating a second sealing member on at least one of the first and second banks; bonding the first and second substrates to each other; curing the first sealing member; and curing the second sealing member.

For example, the coating of the first sealing member may include coating the first sealing member around an emission region for displaying an image, the forming of the first bank may include forming the first bank around the first sealing member, and the forming of the second bank may include forming the second bank around the first sealing member.

Alternatively, the forming of the first bank may include forming the first bank around an emission region for displaying an image, the forming of the second bank may include forming the second bank around the emission region, and the coating of the first sealing member may include coating the first sealing member around the second bank.

The sum of a height of the first bank and a height of the second bank may be less than a distance between the bonded first and second substrates.

The forming of the first bank may include forming a plurality of first dam shapes facing each other so as to form a recess for accommodating the second sealing member, and the forming of the second bank may include forming a plurality of second dam shapes facing each other so as to form a recess for accommodating the second sealing member, and facing the plurality of first dam shapes of the first bank.

Also, the forming of the first bank may further include forming a recess formed by the first substrate and two first dam shapes facing and separated from each other, or a recess formed by two first dam shapes facing each other and integrated on the first substrate. The forming of the second bank may further include forming a recess formed by the second substrate and two second dam shapes facing and separated from each other, or a recess formed by two second dam shapes facing each other and integrated on the second substrate.

The second sealing member may be filled in the recesses of the first and second banks, and may penetrate into a gap between the plurality of first dam shapes of the first bank and the plurality of second dam shapes of the second bank.

The forming of the first bank and the forming of the second bank may include forming the first and second banks so as to have a gap between the first and second banks in an uneven structure in which the first and second banks are engaged with each other, and the coating of the second sealing member may include coating the second sealing member so as to be filled in the gap between the first and second banks.

The second sealing member may include at least one of epoxy, acryl, and urethane-based materials.

The forming of the first bank may include forming the first bank by using a material for forming a pixel defining layer of the first substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

The following descriptions and the attached drawings are provided to provide an understanding of the operations of the present invention, but some operations that can be easily realized by one of ordinary skill in the art may not be described.

Also, the present specification and the drawings are not provided to limit the scope of the invention which should be defined by the following claims. Terms used herein should be construed as having meanings and concepts corresponding to the technical concepts of the present invention in order to most appropriately describe the invention.

Hereinafter, the present invention will be described in detail by explaining embodiments of the invention with reference to the attached drawings.

Figure 1:
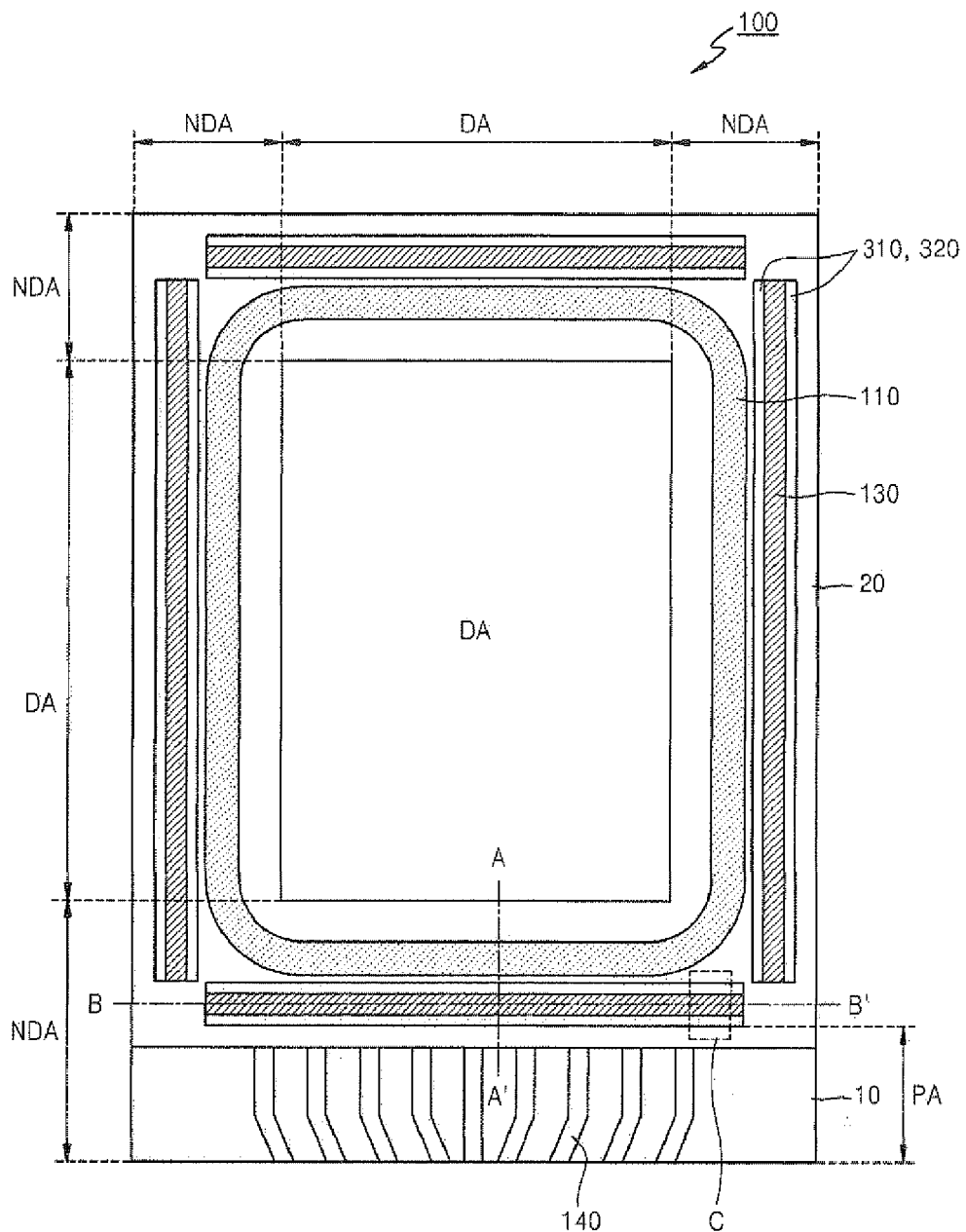
FIG. 1 is a plan view of a flat panel display panel according to an embodiment of the present invention.

FIG. 1 is a plan view of a flat panel display panel 100 according to an embodiment of the present invention.

Referring to FIG. 1, the flat panel display panel 100 comprises a first substrate 10 including thin-film transistors (TFTs) and emission pixels, and a second substrate 20 which is sealed and bonded to the first substrate 10.

Pixel circuits, driving circuits and electrodes may be formed on the first substrate 10. If the flat panel display panel 100 is a panel for an organic electroluminescence display device, organic light-emitting diodes (OLEDs) may be further formed on the first substrate 10. If the flat panel display panel 100 is a panel for a liquid crystal display (LCD) device, a liquid crystal layer may be disposed between the first and second substrates 10 and 20, respectively. Also, the first substrate 10 may be a low-temperature polysilicon (LTPS) (crystalline silicon) substrate, a glass substrate, a plastic substrate, a stainless using steel (SUS) substrate, etc.

The second substrate 20 may be a sealing substrate disposed on the first substrate 10 so as to prevent moisture or oxygen from an external environment from penetrating into the TFTs and the emission pixels formed on the first substrate 10. The second substrate 20 is disposed facing the first substrate 10, and the first and second substrates 10 and 20, respectively, are bonded to each other by a first sealing member 110 and a second sealing member 130 disposed along edges of the first and second substrates 10 and 20, respectively. The second substrate 20 may be formed of a transparent material, and may be a glass substrate or a plastic substrate.

The first substrate 10 includes an emission region DA for emitting light and a non-emission region NDA surrounding the emission region DA. According to embodiments of the present invention, the first and second sealing members 110 and 130, respectively, are disposed on the non-emission region NDA around the emission region DA so as to bond the first and second substrates 10 and 20, respectively, to each other. The second sealing member 130 is disposed between the first and second substrates 10 and 20, respectively, together with a first bank 320 formed on the first substrate 10 and a second bank 310 formed on the second substrate 20.

Although the first sealing member 110 is disposed around the emission region DA and the second sealing member 130 is disposed around the first sealing member 110 in FIG. 1, the second sealing member 130 may be disposed around the emission region DA and the first sealing member 110 may be disposed around the second sealing member 130. For example, if a sufficient dead space is allowed, as in a large-size panel, the second sealing member 130 may be disposed between the first sealing member 110 and the emission region DA.

If the flat panel display panel 100 is a panel for an organic light emitting display device having an active matrix (AM) structure, OLEDs, TFTs for driving the OLEDs, and wiring electrically connected to them are formed on the emission region DA of the first substrate 10. The non-emission region NDA may include a pad region PA in which pads 140 extend from the wiring of the emission region DA.

Figure 2:
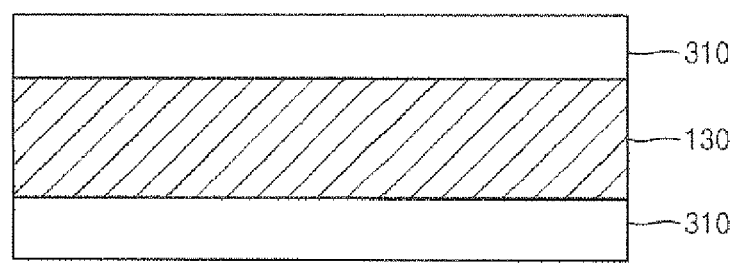
FIG. 2 is a plan view of a region C illustrated in FIG. 1.

FIG. 2 is a plan view of a region C illustrated in FIG. 1.

Referring to FIG. 2, by forming a bank structure on the first and second substrates 10 and 20, respectively, coating the second sealing member 130 on the bank structure, and bonding the first and second substrates 10 and 20, respectively, to each other, the second sealing member 130 is prevented from diffusing to an undesired region when the second sealing member 130 is cured. Also, by forming the bank structure on both the first and second substrates 10 and 20, respectively, instead of on only one of the first and second substrates 10 and 20, respectively, and coating the second sealing member 130 on the bank structure, a bonding area between the second sealing member 130 and the bank structure is increased.

Figure 3:
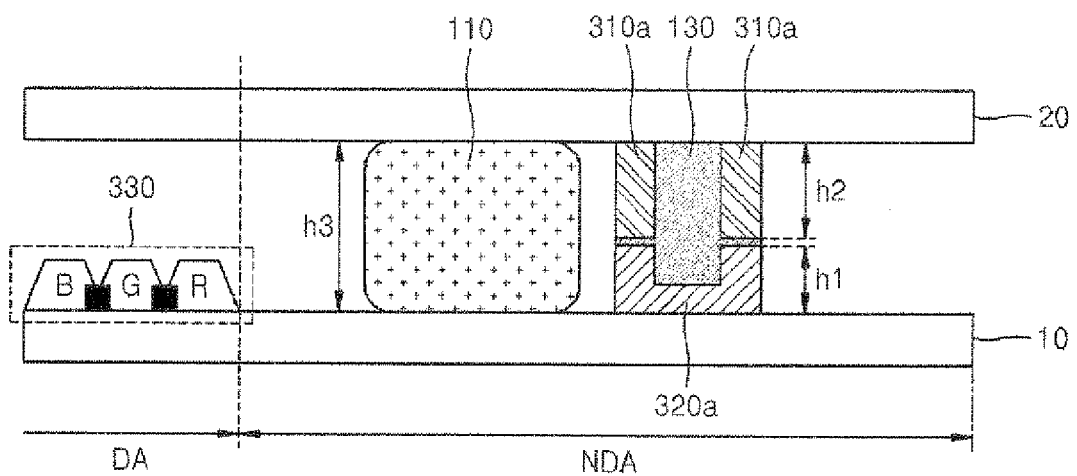
FIG. 3 is a cross-sectional view taken along a line A-A' illustrated in FIG. 1 according to an embodiment of the present invention.

FIG. 3 is a cross-sectional view taken along a line A-A' illustrated in FIG. 1 according to an embodiment of the present invention.

Referring to FIG. 3, the first sealing member 110 is disposed on the non-emission region NDA around the emission region DA, and the second sealing member 130 is disposed around the first sealing member 110. Pixels 330 are formed on the emission region DA.

A first bank 320a is formed by forming two first dam shapes in parallel on the first substrate 10 so as to form a recess, and a second bank 310a is formed by forming two second dam shapes in parallel on the second substrate 20 so as to form a recess. The second sealing member 130 is disposed in a space formed by the first and second banks 320a and 310a, respectively. Also, the sum of a height h1 of the first bank 320a and a height h2 of the second bank 310a may be less than a distance h3 between the first and second substrates 10 and 20, respectively. As such, when the first and second substrates 10 and 20, respectively, are bonded to each other, the second sealing member 130 may penetrate into a gap between the first and second banks 320a and 310a, respectively, and thus a bonding area between the second sealing member 130 and a bank structure may be maximized. For this, the amount of the second sealing member 130 to be coated on the first bank 320a and/or the second bank 310a may be determined in such a way that the second sealing member 130 is filled in the recesses of the first and second banks 320a and 310a, respectively, and penetrates into the gap between the first and second banks 320a and 310a, respectively. Also, the height of a seal spacer may be less than a height (h3) of the first sealing member 110.

For example, the first sealing member 110 may include at least one of photocurable resin, thermosetting resin and frit. The second sealing member 130 may include at least one of epoxy, acryl and urethane-based materials. The second sealing member 130 may improve the mechanical strength of the flat panel display panel 100, and may absorb impacts.

FIGS. 4A thru 4G are cross-sectional views for describing a method of manufacturing the flat panel display panel 100 illustrated in FIGS. 1 thru 3 according to an embodiment of the present invention.

Figure 4A:
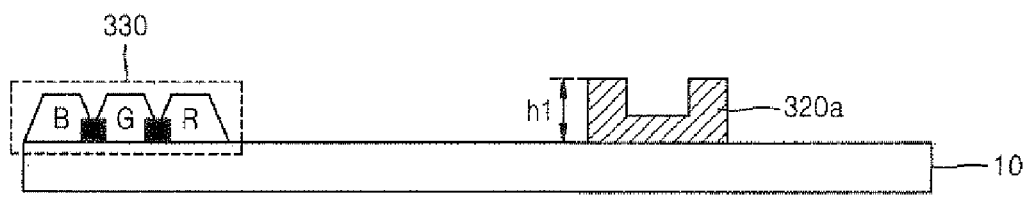
FIGS. 4A thru 4G are cross-sectional views for describing a method of manufacturing the flat panel display panel illustrated in FIGS. 1 thru 3 according to an embodiment of the present invention.

Referring to FIGS. 4A thru 4G, initially, the first bank 320a is formed on the first substrate 10. As illustrated in FIG. 4A, the first bank 320a may be formed by integrally forming two first dam shapes in the form of U on the first substrate 10. The first bank 320a may be formed while forming a pixel defining layer of the pixels 330 by using a material for forming the pixel defining layer. Also, the first bank 320a maybe formed as an organic layer formed of an acryl-based material, or as an inorganic layer formed of SiNx or SiO2.

Figure 4B:
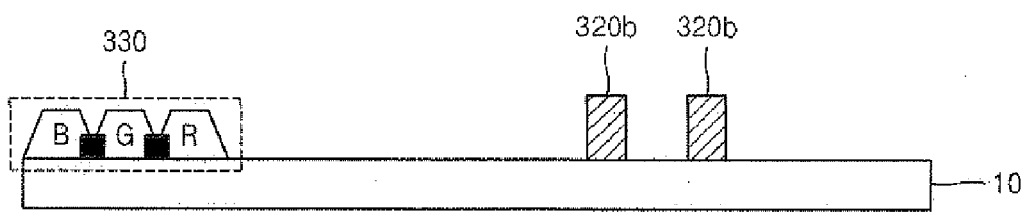

Although the first bank 320a in the form of U is illustrated in FIG. 4A, alternatively, as illustrated in FIG. 4B, a first bank 320b may be formed by separately forming two first dam shapes in parallel in the form of 11.

Figure 4C:
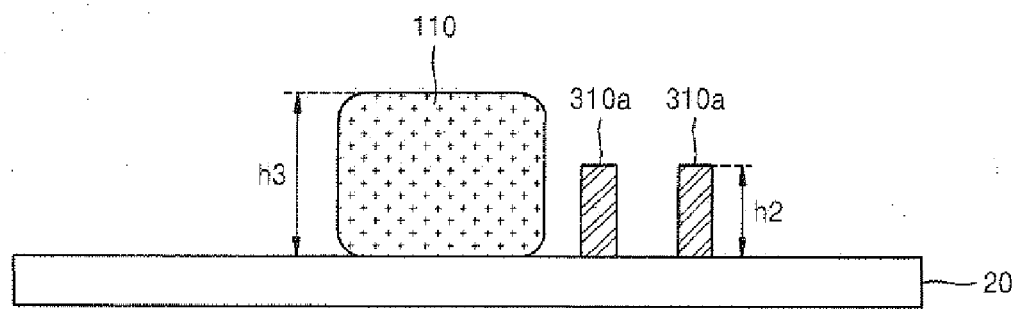

Also, as illustrated in FIG. 4C, the first sealing member 110 is coated on the second substrate 20 and the second bank 310a is formed. As illustrated in FIG. 4C, the second bank 310a may be formed by separately forming two second dam shapes in parallel in the form of 11. Alternatively, as illustrated in FIG. 4D, a second bank 310b may be formed by integrally forming two second dam shapes in the form of U on the second substrate 20.

Figure 4D:
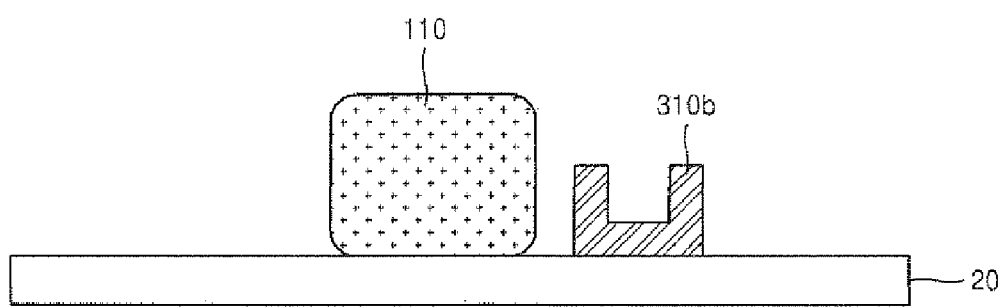
Figure 4E:
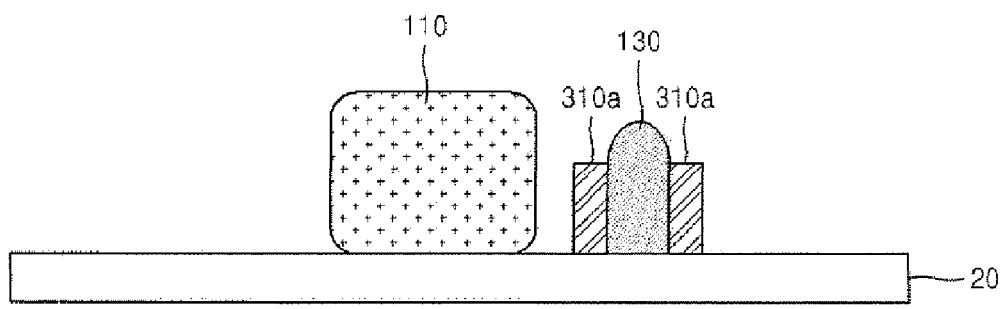

Then, as illustrated in FIG. 4E, the second sealing member 130 is coated on at least one of the first bank 320a (FIG. 4A) or 320b (FIG. 4B) and the second bank 310a (FIG. 4E) or 310b (FIG. 4D). Alternatively, the second sealing member 130 may be coated on both the first bank 320a (FIG. 4A) or 320b (FIG. 4B) and the second bank 310a (FIG. 4E) or 310b (FIG. 4D).

Figure 4F:
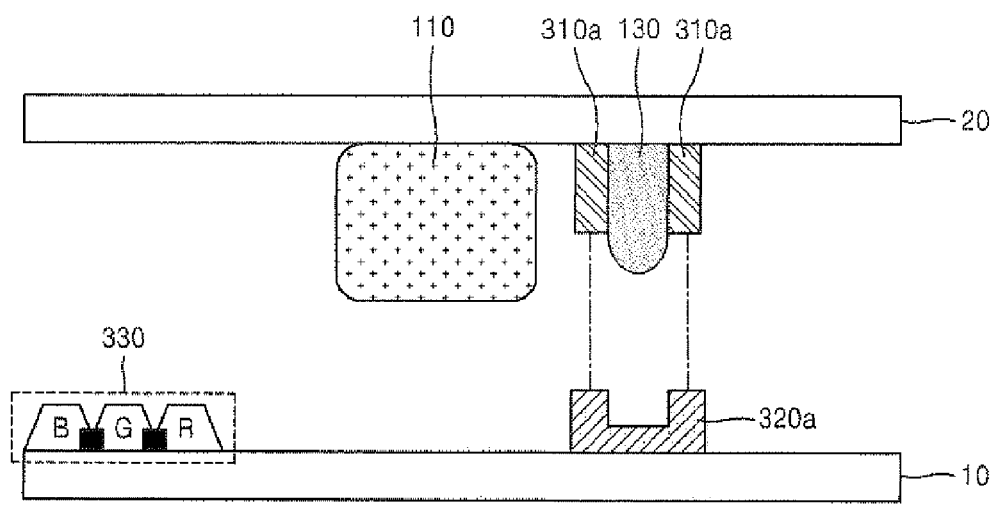
Figure 4G:
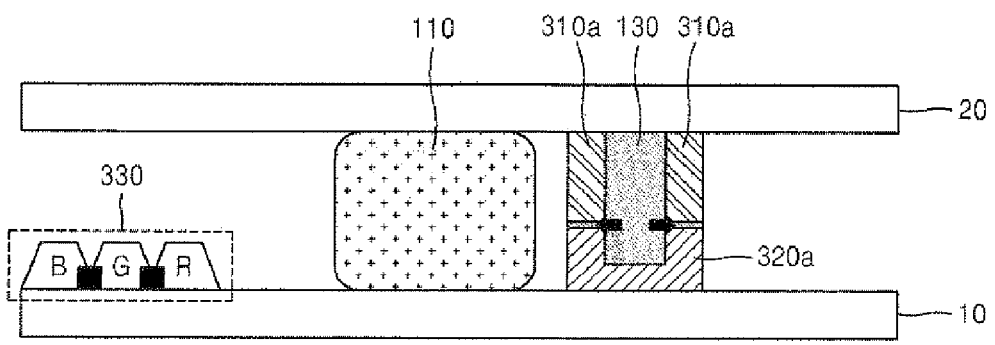

Then, as illustrated in FIG. 4F, the second substrate 20 is turned upside down and the first and second substrates 10 and 20, respectively, are bonded to each other. When the first and second substrates 10 and 20, respectively, are bonded to each other, as illustrated in FIG. 4G, the second sealing member 130 is filled between the first bank 320a or 320b and the second bank 310a or 310b, and penetrates into a gap between the first bank 320a or 320b and the second bank 310a or 310b. After that, a process of irradiating heat, ultraviolet (UV) light or laser to cure the first sealing member 110, and a process of irradiating heat, UV light or laser to cure the second sealing member 130, may be performed.

Figure 5:
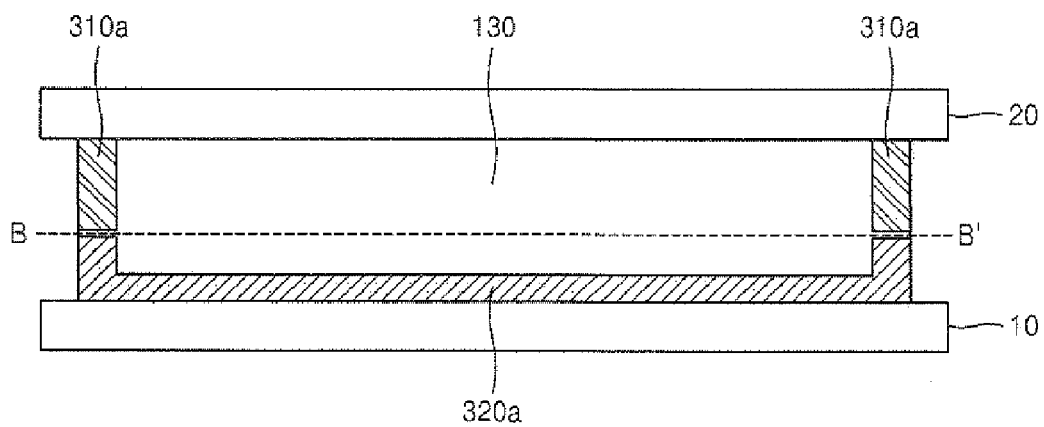
FIG. 5 is a cross-sectional view taken along a line B-B' illustrated in FIG. 1 according to an embodiment of the present invention.

FIG. 5 is a cross-sectional view taken along a line B-B' illustrated in FIG. 1 according to an embodiment of the present invention.

Referring to FIG. 5, recesses of the first bank 320a and the second bank 310a may be planar. Also, as illustrated in FIG. 5, the second sealing member 130 may be filled in the recesses of the first bank 320a and the second bank 310a.

Figure 6:
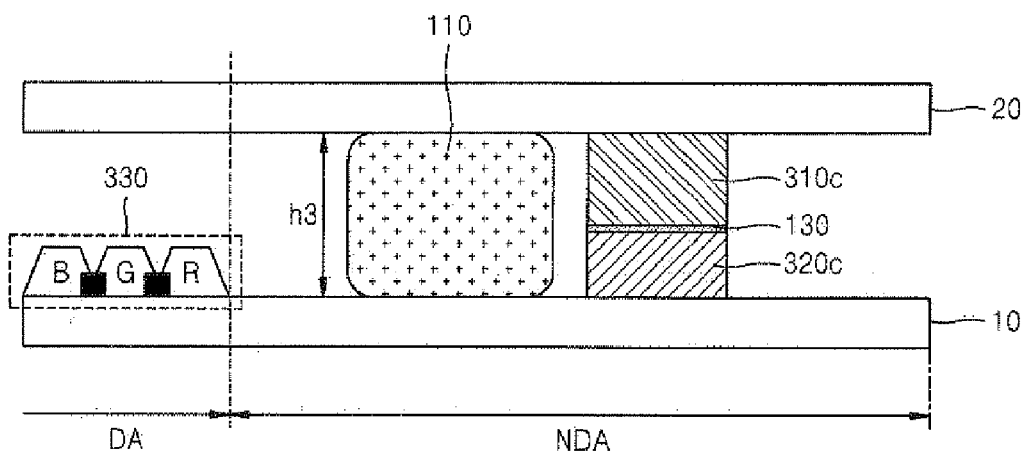
FIG. 6 is a cross-sectional view taken along the line A-A' illustrated in FIG. 1 according to another embodiment of the present invention.

FIG. 6 is a cross-sectional view taken along the line A-A' illustrated in FIG. 1 according to another embodiment of the present invention.

Referring to FIG. 6, a first bank 320c and a second bank 310c may have a planar shape instead of dam shapes.

Figure 7:
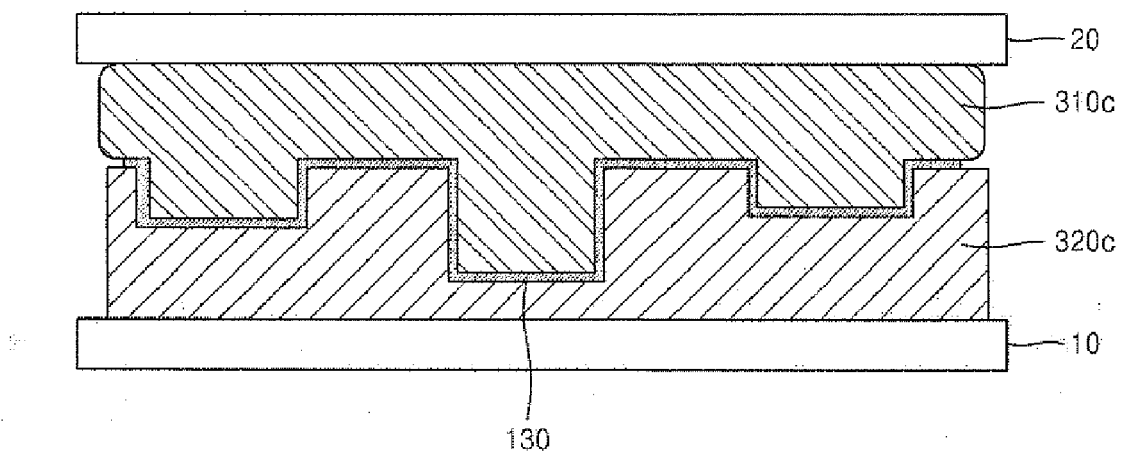
FIG. 7 is a cross-sectional view taken along the line B-B' illustrated in FIG. 1 according to another embodiment of the present invention.

FIG. 7 is a cross-sectional view taken along the line B-B' illustrated in FIG. 1 according to another embodiment of the present invention.

Referring to FIG. 7, the first and second banks 320c and 310c, respectively, may have a gap therebetween in an uneven structure. In this case, the second sealing member 130 is filled in the gap between the first and second banks 320c and 310c, respectively. Due to the uneven structure, a bonding area between a bank structure and the second sealing member 130 may be maximized, and thus mechanical strength and bonding efficiency may also be maximized.

Also, the first bank 320a or 320b and the second bank 310a or 310b illustrated in FIGS. 4A thru 4G may have the uneven structure. In this case, when the second sealing member 130 is filled in the gap between the first bank 320a or 320b and the second bank 310a or 310b, a bonding area may be maximized, and thus mechanical strength and bonding efficiency may also be maximized.

According to embodiments of the present invention, by disposing an additional sealing member between a first substrate and a second substrate, the mechanical strength of a flat panel display panel may be improved, and impacts may be absorbed.

Also, by increasing contact surfaces of first and second banks for accommodating the additional sealing member, a bonding effect may be increased.

While the present invention has been particularly shown and described with reference to exemplary embodiments thereof, it will be understood by one of ordinary skill in the art that various changes in form and detail may be made therein without departing from the spirit and scope of the invention as defined by the following claims. The exemplary embodiments should be considered in a descriptive sense only, and not for purposes of limitation. Therefore, the scope of the invention is defined not by the detailed description of the invention, but by the following claims, and all differences within the scope will be construed as being included in the present invention.

What is claimed is:

1. A flat panel display panel, comprising:
a first substrate on which a plurality of pixels are formed;
a second substrate disposed so as to face a surface of the first substrate on which the plurality of pixels are formed;
a first sealing member disposed between the first and second substrates for sealing the first and second substrate;
a first bank formed solely on the first substrate;
a second bank formed solely on the second substrate and disposed so as to face the first bank; and
a second sealing member disposed between the first and second banks,
the first bank comprising a plurality of first dam shapes facing each other for forming a recess for accommodating the second sealing member, and the second bank comprising a plurality of second dam shapes facing each other for forming a recess for accommodating the second sealing member, and facing the plurality of first dam shapes of the first bank, and
a gap exists between the first bank and second bank with the second sealing member filling the gap.

2. The flat panel display panel of claim 1, wherein the first sealing member is disposed around an emission region for displaying an image, and wherein the first and second banks are disposed around the first sealing member.

3. The flat panel display panel of claim 1, wherein the first and second banks are disposed around an emission region for displaying an image, and wherein the first sealing member is disposed around the first and second banks.

4. The flat panel display panel of claim 1, wherein a sum of a height of the first bank and a height of the second bank is less than a distance between the first and second substrates.

5. The flat panel display panel of claim 1, wherein the first bank comprises one of a recess formed by the first substrate and two first dam shapes facing and separated from each other, and a recess formed by two first dam shapes facing each other and integrated on the first substrate, and wherein the second bank comprises one of a recess formed by the second substrate and two second dam shapes facing and separated from each other, and a recess formed by two second dam shapes facing each other and integrated on the second substrate.

6. The flat panel display panel of claim 1, wherein the second sealing member is filled in the recesses of the first and second banks, and penetrates into a gap between the plurality of first dam shapes of the first bank and the plurality of second dam shapes of the second bank.

7. The flat panel display panel of claim 1, wherein the first and second banks have a gap between the first and second banks in an uneven structure in which the first and second banks are engaged with each other, and wherein the second sealing member is filled in the gap between the first and second banks.

8. The flat panel display panel of claim 1, wherein the second sealing member comprises at least one of epoxy, acryl and urethane-based materials.

9. The flat panel display panel of claim 1, wherein the first bank is formed while forming a pixel defining layer on the first substrate by using a same material for forming the pixel defining layer.

10. A method of manufacturing a flat panel display panel, the method comprising the steps of:
forming a first bank solely on a first substrate on which a plurality of pixels are formed;
forming a second bank solely on a surface of a second substrate facing the first substrate so as to face the first bank;
coating a first sealing member on the surface of the second substrate;
coating a second sealing member on at least one of the first and second banks;
bonding the first and second substrates to each other;
curing the first sealing member; and
curing the second sealing member,
the step of forming the first bank comprising forming a plurality of first dam shapes facing each other so as to form a recess for accommodating the second sealing member, and the step of forming the second bank comprising forming a plurality of second dam shapes facing each other so as to form a recess for accommodating the second sealing member, and facing the plurality of first dam shapes of the first bank, and
the step of forming the first bank creates a gap between the first bank and second bank with the second sealing member filling the gap.

11. The method of claim 10, wherein the step of coating the first sealing member comprises coating the first sealing member around an emission region for displaying an image, wherein the step of forming the first bank comprises forming the first bank around the first sealing member, and wherein the step of forming the second bank comprises forming the second bank around the first sealing member.

12. The method of claim 10, wherein the step of forming the first bank comprises forming the first bank around an emission region for displaying an image, wherein the step of forming the second bank comprises forming the second bank around the emission region, and wherein the step of coating the first sealing member comprises coating the first sealing member around the second bank.

13. The method of claim 10, wherein a sum of a height of the first bank and a height of the second bank is less than a distance between the bonded first and second substrates.

14. The method of claim 10, wherein the step of forming the first bank further comprises forming one of a recess formed by the first substrate and two first dam shapes facing and separated from each other, and a recess formed by two first dam shapes facing each other and integrated on the first substrate, and wherein the step of forming the second bank further comprises forming one of a recess formed by the second substrate and two second dam shapes facing and separated from each other, and a recess formed by two second dam shapes facing each other and integrated on the second substrate.

15. The method of claim 10, wherein the second sealing member is filled in the recesses of the first and second banks and penetrates into a gap between the plurality of first dam shapes of the first bank and the plurality of second dam shapes of the second bank.

16. The method of claim 10, wherein the step of forming the first bank and forming the second bank comprise forming the first and second banks so as to have a gap between the first and second banks in an uneven structure in which the first and second banks are engaged with each other, and wherein the step of coating the second sealing member comprises coating the second sealing member so as to be filled in the gap between the first and second banks.

17. The method of claim 10, wherein the second sealing member comprises at least one of epoxy, acryl and urethane-based materials.

18. The method of claim 10, wherein the step of forming the first bank comprises forming the first bank while forming a pixel defining layer on the first substrate by using a same material for forming the pixel defining layer.

* * * * *